United States Patent [19]

Kusunoki

[11] Patent Number: 5,408,198
[45] Date of Patent: Apr. 18, 1995

[54] SEMICONDUCTOR POWER AMPLIFIER INTEGRATED CIRCUIT

[75] Inventor: Shigeo Kusunoki, Kanagawa, Japan

[73] Assignee: Sony Corporation, Japan

[21] Appl. No.: 231,690

[22] Filed: Apr. 25, 1994

[30] Foreign Application Priority Data

Apr. 27, 1993 [JP] Japan .................................. 5-101390

[51] Int. Cl.⁶ ............................................... H03F 3/16
[52] U.S. Cl. ..................................... 330/277; 330/310
[58] Field of Search ............... 330/277, 246, 302, 310, 330/311, 286

[56] References Cited

U.S. PATENT DOCUMENTS 4,275,361 6/1981 Schürmann ......................... 330/277
4,901,032 2/1990 Komiak ............................... 330/277

OTHER PUBLICATIONS

Cellular Telecommunication GaAs Power Modules, Applied Microwave, Fall 1992, pp. 83–88.
"Low-Power-Voltage Operated Power Amplification Module", National Conference of the Institute of Electronics, Information and Communication Engineers of Japan, Spring 1993, Paper C-83.

Primary Examiner—Steven Mottola
Attorney, Agent, or Firm—Ronald P. Kananen

[57] ABSTRACT

A power amplifier is provided which operates in a quasi-microwave band between 0.8 GHz and 2 GHz with a high output, a small size and low power consumption. Junction type GaAs FETs are connected in a multi-stage manner to form an amplification circuit. An impedance matching/phase adjusting circuit is provided between the respective stages. An input impedance matching circuit, an output impedance matching circuit and bypass capacitors for a power source terminal are provided. Further, a gain control terminal and gate bias terminals for setting operating points of the JFETs are provided, thereby forming an entire arrangement as a semiconductor integrated circuit.

6 Claims, 3 Drawing Sheets

SEMICONDUCTOR POWER AMPLIFIER INTEGRATED CIRCUIT

BACKGROUND OF THE INVENTION

1. Field of the Invention

The present invention generally relates to semiconductor power amplifier integrated circuits and, more particularly, is directed to a semiconductor power amplifier integrated circuit suitable for use in a portable telephone terminal.

2. Description of the Related Art

Recently, in land mobile communication such as with a mobile telephone, a portable telephone or the like, a present frequency band allocated to land mobile communication becomes insufficient for radio communication due to an increase in the number of subscribers. Thus, various new services for land mobile communication have been successively started, These new services are common in that they are performed by using digital communication employing a quasi-microwave band of 0.8 to 2 GHz.

At present, the development has been delayed as to microwave integrated circuits such as a monolithic microwave integrated circuit (hereinafter referred to as a MMIC) capable of being used in this frequency band. Terminal devices for such the land mobile communication are indispensable are required to be miniaturized since portability is an important feature the terminal devices. Thus, integration of electric parts used in the terminal device has become a most important problem.

As an example of the related art, there has conventionally been suggested such a semiconductor power amplifier integrated circuit as shown in "Low-Power-Voltage Operated Power Amplification Module", National Conference of the Institute of Electronics, Information and Communication Engineers of Japan, Spring 1993, Paper C-83.

This semiconductor power amplifier integrated circuit uses metal-semiconductor field effect transistors (hereinafter referred to simply as MES FETs) and is integrated in the form of a monolithic microwave integrated circuit (MMIC) up to a drive stage. However, a last stage is provided from the outside as an external part.

As another example of the related art, there is a semiconductor power amplifier integrated circuit as disclosed in "Cellular Telecommunication GaAs Power Module", the Applied Micro-wave, Fall, 1992, pp. 83–88.

Such a semiconductor power amplifier integrated circuit also uses MES FETs and input and output impedance matching circuits thereof are constituted by a distributed constant circuit.

Further, a circuit impedance connected to each of the MES FETs is set in a stable region of each of the MES FETs, respectively.

Since the aforesaid conventional semiconductor power amplifier integrated circuits employ MES FETs each requiring a negative voltage as its gate voltage, these circuits have a major problem in that a negative power source must be employed when the semiconductor power amplifier integrated circuit is applied to a telephone terminal device.

Furthermore, since the circuit impedances connected to the respective MES FETs are required to be set in stable regions of the MES FETs, the degree of freedom upon designing the circuit arrangement is restricted when designing the amplification factor of an amplifier which is sufficiently large.

For this reason, for the purpose of obtaining a necessary amplification factor in such a conventional amplifier, the number of FETs has been increased, which, however, results in an increase of power consumption. Thus, it has been difficult to apply such a conventional amplifier to an apparatus favorably requiring less power consumption such as a portable telephone terminal device.

OBJECTS AND SUMMARY OF THE INVENTION

It is an object of the present invention to provide a semiconductor power amplifier integrated circuit in which the aforementioned shortcomings and disadvantages encountered with the related art can be eliminated.

More specifically, it is an object of the present invention to provide a semiconductor power amplifier integrated circuit which can operate only by a positive power source without the need for a negative power source, and can use a lesser number of field effect transistors (FETs) with a small size, low power consumption and high output.

As an aspect of the present invention, a semiconductor power amplifier integrated circuit is comprised of a first amplification stage including a dual-gate junction type field effect transistor, the dual-gate junction field effect transistor having a first gate electrode connected to a signal input terminal through an input impedance matching circuit, a second gate electrode connected to a control terminal through a first resistance element, a source electrode connected to the ground, and a drain electrode connected to a power source terminal through a first inductance element and also connected to one terminal of a first coupling capacitance element, a second amplification stage including a first junction type field effect transistor, the first junction field effect transistor having a gate electrode connected to the other terminal of the first capacitance element, a source electrode connected to the grounded, and a drain electrode connected to the power source terminal through a second inductance element and also connected to one terminal of a second coupling capacitance element, a third amplification stage including a second junction type field effect transistor, the second junction type field effect transistor having a gate electrode connected to the other terminal of the second capacitance element, a source electrode connected to the grounded, and a drain electrode connected to an output terminal through an output impedance matching circuit, a first gate bias terminal connected to the first gate electrode of the dual-gate junction type field effect transistor through a second resistance element and also connected to the gate electrode of the first junction type field effect transistor through a third resistance element, and a second gate bias terminal connected to the gate electrode of the second junction type field effect transistor through a fourth resistance element.

A semiconductor power amplifier integrated circuit in accordance to the present invention employs junction type GaAs field effect transistors (GaAs JFETs, which will be hereinafter referred to merely as JFETs) which are connected in a manner to form an amplifier circuit and which are also connected to a positive power source in operation.

The respective amplification stages are connected to each other through coupling capacitors therebetween to operate the respective stages independently in terms of a DC current. A phase-adjusting/impedance matching circuit is provided for signal phase adjustment to prevent any oscillation.

As a result, even when the JFET of each of the amplification stages is selected to have a large amplification factor, the amplifier circuit can be operated stably, so that the amplification factor per stage can be increased and thus the number of necessary amplification stages can be reduced.

Accordingly, the integrated circuit can be made small in size with less power consumption.

The semiconductor power amplifier integrated circuit according to the present invention is provided therein with an input impedance matching circuit and and output impedance matching circuit for facilitating connection with another circuit.

Bypass capacitors are connected to a power source terminal for removing the influences due to stray capacitance of extracting lead wires on the integrated circuit. As a result, connection between the integrated circuit and a power source can be facilitated and the integrated circuit becomes suitable for mass production.

A dual-gate junction type GaAs FET having first and second gate electrodes is employed as an amplifier for the primary stage. A voltage applied to the second gate electrode is provided through a control terminal and controlled externally to realize the gain control of the semiconductor power amplifier integrated circuit according to the present invention.

A gate bias terminal for determining the operating point of the JFET of each of the amplification stages is provided to allow the operating points to be controlled externally. More specifically, a plurality of such gate bias terminals are preferably provided so that the primary stages are operated as class-A amplifiers having a good linearity while the rear stage is operated as a class-AB amplifier.

The preceding and other objects, features, and advantages of the present invention will become apparent from the following detailed description of an illustrative embodiment thereof when read in conjunction with the accompanying drawings.

DESCRIPTION OF THE PREFERRED EMBODIMENT

Figure 1:
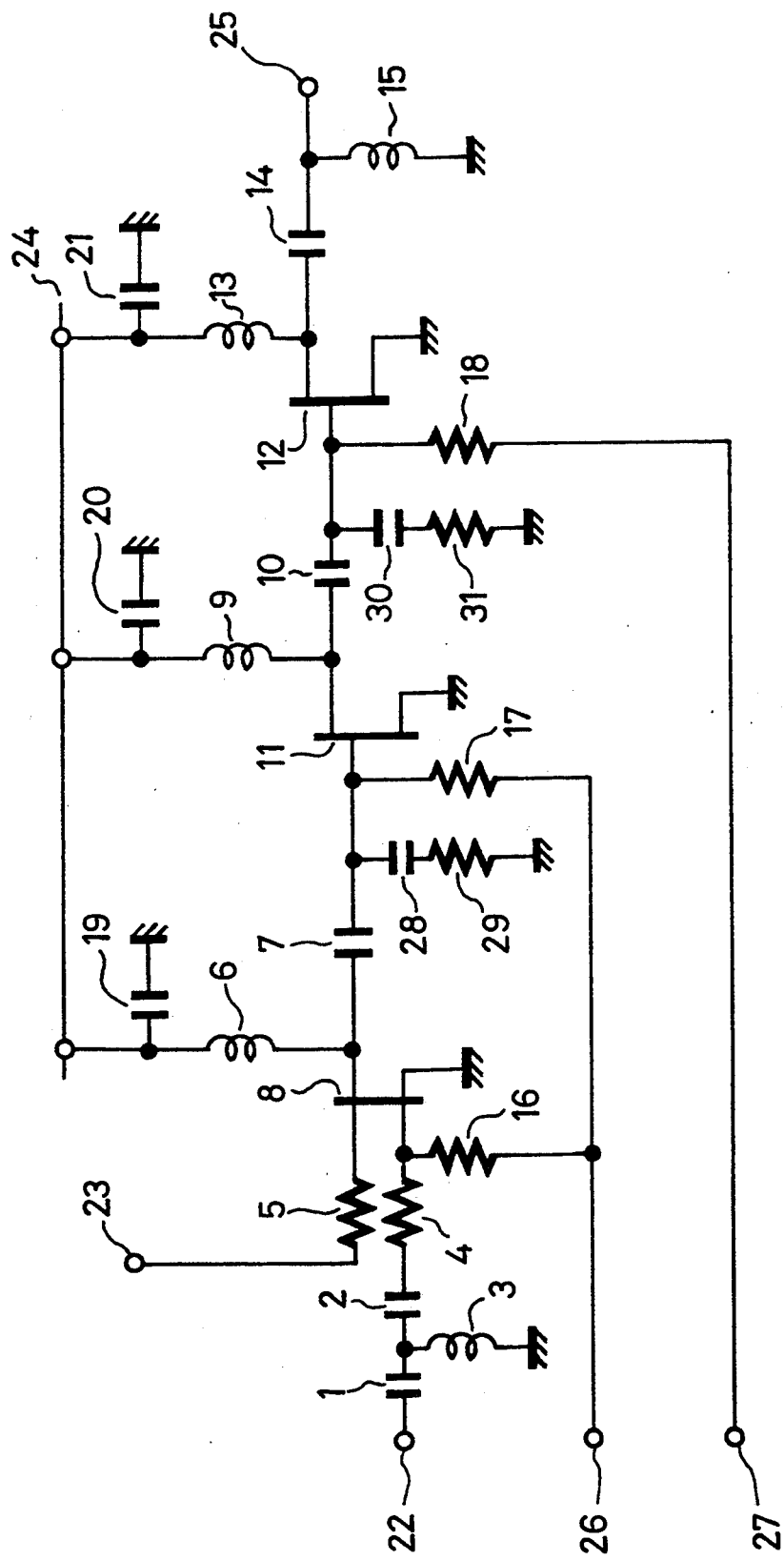
FIG. 1 is a schematic circuit diagram showing a semiconductor power amplifier integrated circuit according to an embodiment of the present invention.

A semiconductor power amplifier integrated circuit according to the embodiment of the present invention will now be described with reference to FIGS. 1 to 3. FIG. 1 shows a circuit diagram of the semiconductor power amplifier integrated circuit according to the embodiment of the present invention.

Referring to FIG. 1, each of a plurality of junction type GaAs FETs 8, 11 and 12 operates in a so-called enhancement mode in which no drain current flows when a gate voltage is zero and, as the gate voltage increases, the channel charge is increased to increase the drain current.

Further, in FIG. 1, such circuit elements as resistances, capacitances and inductances are formed as included in an integrated circuit. In the following explanation, such elements are expressed as resistance elements, capacitance elements and inductance elements, respectively.

In FIG. 1, a circuit formed of capacitance elements 1 and 2, an inductance element 3 and a resistance element 4 is an input impedance matching circuit, in which, as illustrated, the capacitance elements 1 and 2 are connected in series while the inductance element 3 is connected between ground and a junction point between the capacitance elements 1 and 2. The free end of the capacitance element 1 is connected to a signal input terminal 22, and the free end of the capacitance element 2 is connected to one end of the resistance element 4. The other end of the resistance element 4 serving as an output terminal of the input impedance matching circuit is connected to a first gate electrode of the gate junction type GaAs FET 8.

The gate junction type GaAs FET 8, which forms a first amplification stage, has a second gate electrode which is applied with a control voltage from a control terminal 23 through a resistance element 5. The FET 8 has a source electrode grounded and a drain electrode connected to a power source terminal 24 through an inductance element 6.

The drain electrode of the FET 8 is also connected through a capacitance element 7 to a gate electrode of the JFET 11 constituting a second amplification stage. The JFET 11 has a source electrode grounded and a drain electrode connected to the power source terminal 24 via an inductance element 9.

The drain electrode of the JFET 11 is also connected through a capacitance element 10 to a gate electrode of the JFET 12 constituting a third amplification stage. The JFET 12 has a source electrode grounded and a drain electrode connected to the power source terminal 24 via an inductance element 13.

The drain electrode of the JFET 12 is also connected to an output impedance matching circuit which is formed of the inductance element 13, a capacitance element 14 and an inductance element 15. As illustrated, more specifically, the output impedance matching circuit has an input point connected to the drain electrode of the JFET 12, the inductance element 13 is connected between the input point and the power source terminal 24, the capacitance element 14 is connected between the input point and an output terminal 25, and the inductance element 15 is connected between the output terminal 25 and ground.

The first gate electrode of the dual-gate JFET 8 constituting the first amplification stage and the gate electrode of the JFET 11 constituting the second amplification stage are connected to a first gate bias terminal 26 through resistance elements 16 and 17, respectively. The gate electrode of the JFET 12 constituting the third amplification stage is connected to a second gate bias terminal 27 through a resistance element 18.

A series circuit of a capacitance element 28 and a resistance element 29 is connected between the gate electrode of the JFET 11 and ground, while a series circuit of a capacitance element 30 and a resistance element 31 is connected between the gate electrode of the JFET 12 and ground. These series circuits serve to perform impedance matching between the amplification stages, in particular, to adjust signal phase to thereby prevent oscillation.

Capacitance elements 19, 20 and 21 are respectively connected between ground and power source junction points of the inductance elements 6, 9 and 13 connected to the drain electrodes of the JFETs at the respective amplificatoin stages. These capacitance elements 19 to 21 function as bypass capacitors for power extracting lead wires of the integrated circuit according to the embodiment.

Operation of the circuit shown FIG. 1 will be described below. First, the power source is turned on to apply a power source voltage to the power source terminal 24. The power source voltage is, for example, +3 V.

Bias voltages are applied to the first and second gate bias terminals 26 and 27, respectively. These bias voltages applied to the first and second gate bias terminals 26 and 27 are, for example, 0.5 V and 0.3 V, respectively.

The control voltage is applied to the control terminal 23. The gain of the power amplification circuit according to the embodiment can be varied by changing the control voltage as will be explained later.

A signal applied to the input terminal 22 is amplified through the first to third amplification stages and then outputted to the output terminal 25. In this case, the JFETs of the first and second amplification stage are operated as class-A amplifiers, whereas the JFET of the third amplification stage is operated as a class-AB amplifier.

Figure 2:
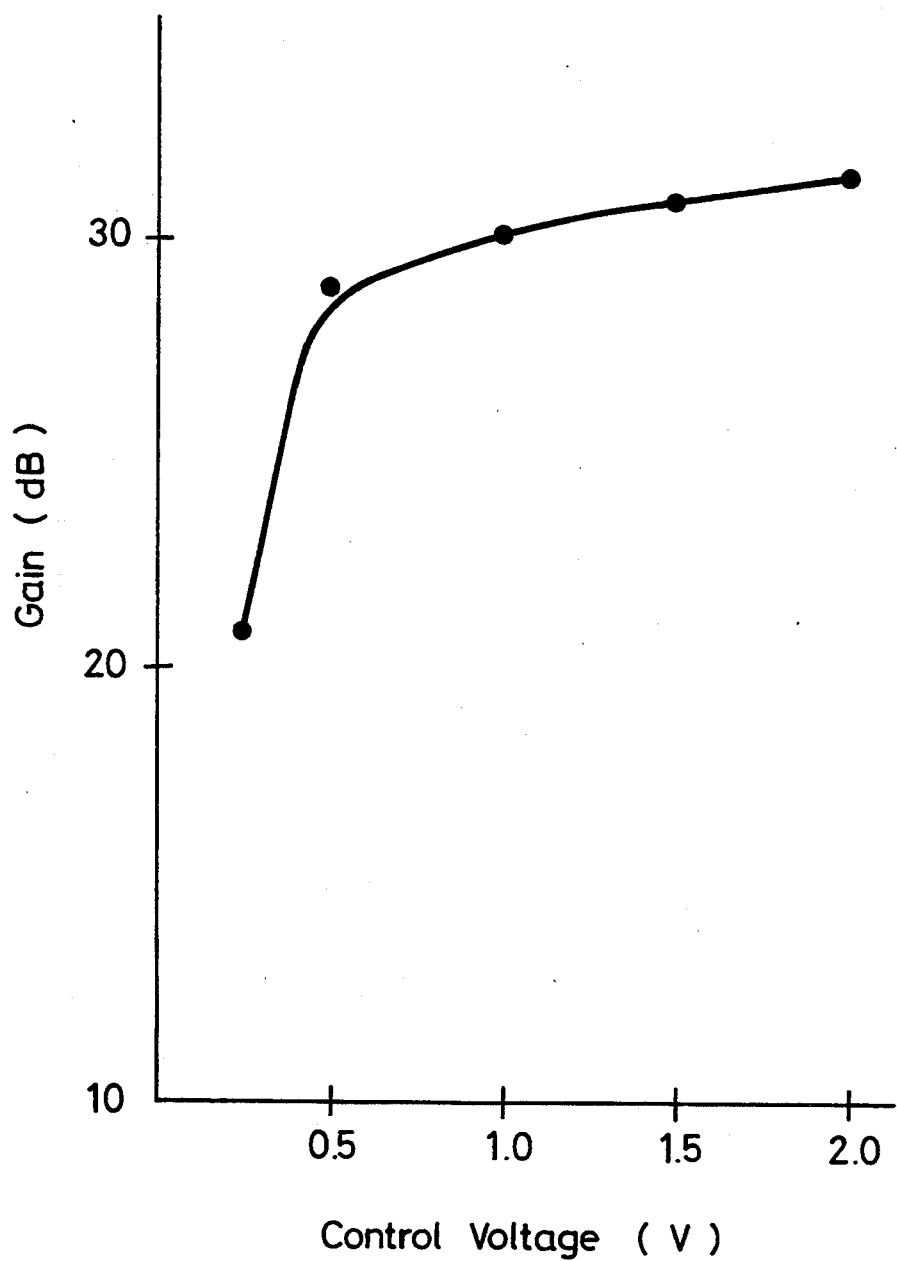
FIG. 2 is a characteristic diagram showing a relationship between a control voltage applied to a control terminal of the semiconductor power amplifier integrated circuit according to the embodiment of the present invention and the gain thereof.

FIG. 2 shows a relationship between a control voltage applied to the control terminal 23 and the gain of the JFET 8 in FIG. 1. As will be clear from FIG. 2, the gain sharply changes or increases with the increase of the control voltage till about 0.5 V and slowly changes or increases with the increase of the control voltage above about 0.5 V.

Figure 3:
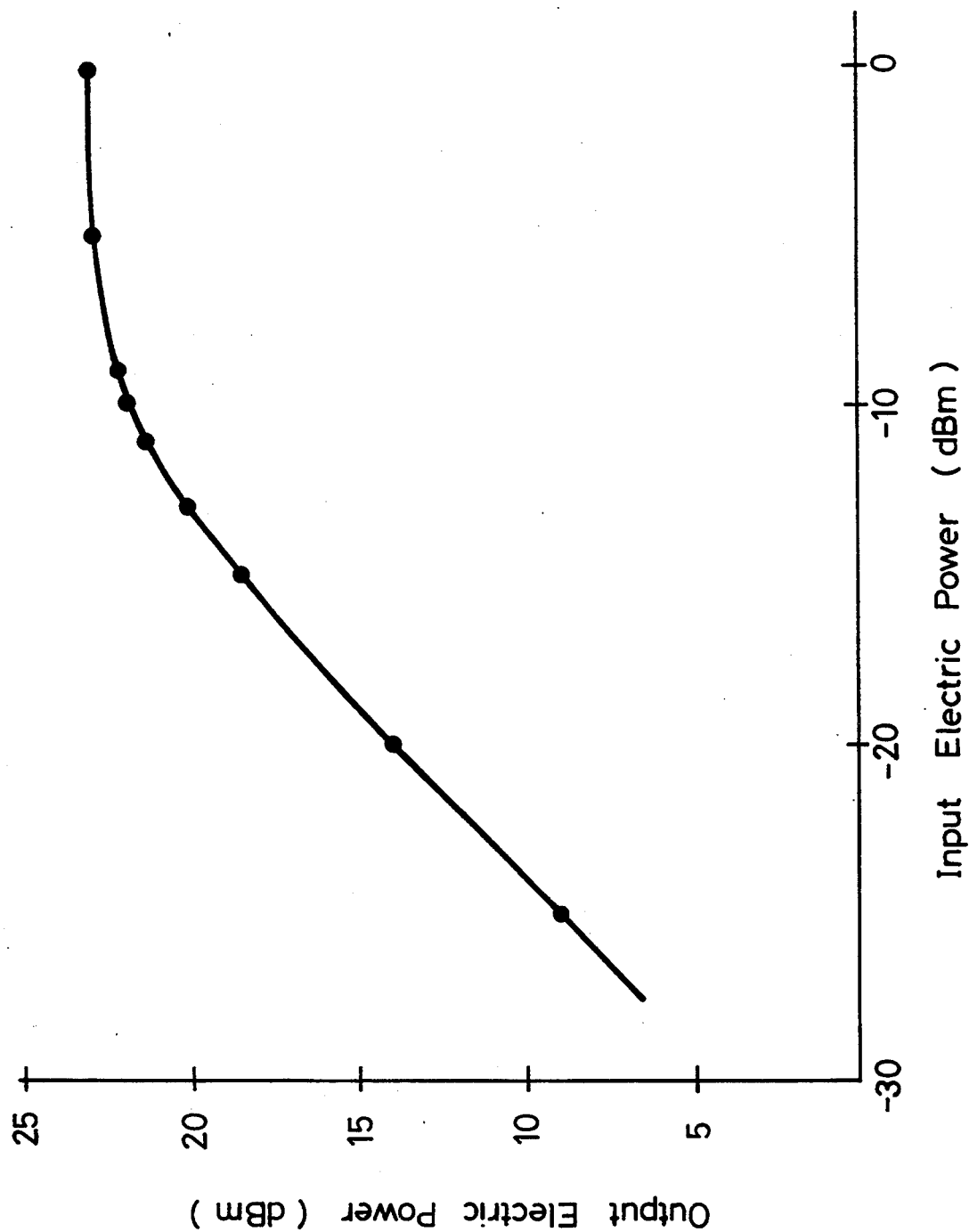
FIG. 3 is a characteristic diagram showing an input-/output characteristic of the semiconductor power amplifier integrated circuit according to the embodiment of the present invention.

FIG. 3 shows an example of an input/output characteristic of the semiconductor power amplification integrated circuit of the embodiment. As illustrated, the output power of the integrated circuit increases substantially linearly when input power thereof increases from −25 dBm to −10 dBm. In the embodiment, a gain suppressed output of 21 dBm is obtained with a battery voltage of 3 volts, as will be clear from FIG. 3.

The semiconductor power amplifier integrated circuit of the present embodiment has an advantage that, since the integrated circuit employs GaAs JFETs, the circuit can operate only by a positive power source without a need for preparation of a negative power source.

The entire size of the integrated circuit can be made small since a matching circuit such as the input or output impedance matching circuit or the like employs a lumped-constant circuit, and further, the need for any part to be connected from the outside is eliminated.

In the aforementioned circuit of the embodiment, there are provided an input impedance matching circuit, the impedance matching circuit formed by the capacitance element 28 and the resistance element 29 connected between the gate electrode of the JFET 11 and the ground, and an impedance matching circuit formed by the capacitance element 30 and resistance element 31 connected between the gate electrode of the JFET 12 and the ground. Therefore, even when any impedance circuit is connected to the JFETs, the respective JFETs can be operated stably. As a consequence, matching between the JFETs cannot be restricted in stability, which results in an amplifier having a sufficiently large amplification factor which can be obtained with a lesser number of JFETs.

The capacitance elements 19, 20 and 21 function to reduce the impedance of the power source to such an extent as to be able to neglect the influences of bonding wires and play an important role in the stabilizing operation of the integrated circuit.

If these capacitance elements were not provided, impedance adjustment would have to be carried out by the lead wires extracted form the semiconductor power amplifier integrated circuit of FIG. 1. This results in an integrated circuit which is unsuitable for mass production due to a troublesome impedance adjustment.

The semiconductor power amplifier integrated circuit according to the present invention can operate only by a positive power source since it employs the GaAs JFETs, so that the need for preparation of a negative power source can be eliminated.

Further, in the present invention, since the impedance matching circuits employ lumped-constant circuits and the integrated circuit can be designed so as to eliminate the need for any part connected from the outside, the entire size of the integrated circuit can be made small.

Furthermore, for the purpose of stabilizing the operation of the integrated circuit, the impedance matching circuit is provided for each of the amplification stages. Thus, even when the junction type GaAs FET of each of the amplification stages is selected to have a large amplification factor, the integrated circuit can be stably operated. Thus, the number of necessary junction type GaAs FETs can be reduced, and an amount of consumed power can be decreased.

The above advantages become highly effective when the semiconductor power amplifier integrated circuit according to the present invention is applied to a portable telephone.

Having described a preferred embodiment of the invention with reference to the accompanying drawings, it is to be understood that the invention is not limited to the precise embodiment and that various changes and modifications thereof could be effected by one skilled in the art without departing from the spirit or scope of the novel concepts of the invention as defined in the appended claims.

What is claimed is:

1. A semiconductor power amplifier integrated circuit comprising:
   a first amplification stage including a dual-gate junction type field effect transistor, said dual-gate junction type field effect transistor having a first gate electrode connected to a signal input terminal through an input impedance matching circuit, a second gate electrode connected to a control terminal through a first resistance element, a source electrode connected to ground, and a drain electrode connected to a power source terminal through a first inductance element and also connected to one terminal of a first coupling capacitance element;
   a second amplification stage including a first junction type field effect transistor, said first junction field effect transistor having a gate electrode connected to the other terminal of said first capacitance element, a source electrode connected to ground, and a drain electrode connected to said power source terminal through a second inductance element and also connected to one terminal of a second coupling capacitance element;

a third amplification stage including a second junction type field effect transistor, said second junction type field effect transistor having a gate electrode connected to the other terminal of said second capacitance element, a source electrode connected to ground, and a drain electrode connected to an output terminal through an output impedance matching circuit;

a first gate bias terminal connected to said first gate electrode of said dual-gate junction type field effect transistor through a second resistance element and also connected to said gate electrode of said first junction type field effect transistor through a third resistance element; and a second gate bias terminal connected to said gate electrode of said second junction type field effect transistor through a fourth resistance element.

2. A semiconductor power amplifier integrated circuit according to claim 1, wherein said input impedance matching circuit is formed of a third capacitance element connected at its one end to said signal input terminal, a fourth capacitance element connected at its one end to the other end of said third capacitance element, a third inductance element connected between ground and a junction point between said third and fourth capacitance elements, and a fifth resistance element connected at its one end to the other end of said fourth capacitance element and also connected at the other end thereof to said first gate electrode of said dual-gate junction type field effect transistor.

3. A semiconductor power amplifier integrated circuit according to claim 1, wherein two impedance matching circuits each formed of a series circuit of a resistance element and a capacitance element are provided between ground and the gate electrodes of said first and second junction type field effect transistors, respectively.

4. A semiconductor power amplifier integrated circuit according to claim 1, wherein said output impedance matching circuit is formed of a fourth inductance element connected between said power source terminal and said drain electrode of said second junction type field effect transistor constituting said third amplification stage, a fifth capacitance element connected between said drain electrode of said second junction type field effect transistor and said output terminal, and a fifth inductance element connected between said output terminal and ground.

5. A semiconductor power amplifier integrated circuit according to claim 1, wherein bypass capacitance elements are connected respectively between ground and an end of inductance elements connected to said power source, said inductance elements connected between said power source terminal and the drain electrodes of said junction type field effect transistor.

6. A semiconductor power amplifier integrated circuit according to claim 1, further including a bias circuit means adjusted so that said junction type field effect transistors constituting said first to third amplification stages each operates in an enhancement mode.

* * * * *